United States Patent [19]
Redburn et al.

[11] Patent Number: 6,166,458
[45] Date of Patent: *Dec. 26, 2000

[54] POWER CONDITIONING CIRCUIT

[75] Inventors: James E. Redburn, Sugar Land, Tex.; Leonard E. Webster, Chicago, Ill.

[73] Assignee: Leveler, Chicago, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 09/009,210

[22] Filed: Jan. 20, 1998

[51] Int. Cl.$^7$ ...................................................... H02J 1/02
[52] U.S. Cl. ................................................ 307/105; 333/176
[58] Field of Search ........................... 307/105; 333/12, 333/167, 175–178; 363/39; 327/551

[56] References Cited

U.S. PATENT DOCUMENTS

| | | | |
|---|---|---|---|
| 4,429,338 | 1/1984 | Becker et al. | 361/42 |
| 4,703,386 | 10/1987 | Speet et al. | 361/56 |
| 4,802,055 | 1/1989 | Beckerman . | |
| 4,814,941 | 3/1989 | Speet et al. . | |
| 4,868,732 | 9/1989 | Gillett et al. | 363/90 |
| 4,999,729 | 3/1991 | Stifter . | |
| 5,105,327 | 4/1992 | Wohlforth | 361/56 |
| 5,162,963 | 11/1992 | Washburn et al. | 361/18 |
| 5,206,539 | 4/1993 | Kammeter | 307/105 |
| 5,287,288 | 2/1994 | Brennen et al. | 364/483 |
| 5,355,025 | 10/1994 | Moran et al. | 307/105 |
| 5,448,443 | 9/1995 | Muelleman | 361/111 |
| 5,465,203 | 11/1995 | Bhattacharya et al. | 363/40 |
| 5,490,030 | 2/1996 | Taylor et al. | 361/45 |
| 5,589,718 | 12/1996 | Lee | 307/72 |
| 5,617,284 | 4/1997 | Paradise | 361/58 |
| 5,619,079 | 4/1997 | Wiggins et al. | 307/105 |
| 5,666,255 | 9/1997 | Muelleman | 363/39 |

FOREIGN PATENT DOCUMENTS

WO 96/39735   12/1996   WIPO .

OTHER PUBLICATIONS

International Search Report dated April 23, 1999, Int'l. Appl. No. PCT/US98/27475.

Primary Examiner—Richard T. Elms
Attorney, Agent, or Firm—Marshall, O'Toole, Gerstein, Murray & Borun

[57] ABSTRACT

A power conditioning circuit for conditioning power supplied by a power source at a nominal frequency over line, neutral and ground conductors includes first, second and third impedances coupled to the line, neutral and ground conductors, respectively, and to output lines. Each of the impedances prevents power at frequencies greater than the nominal frequency from reaching the output lines.

20 Claims, 9 Drawing Sheets

POWER CONDITIONING CIRCUIT

TECHNICAL FIELD

The present invention relates generally to power conditioning circuits, and more particularly, to power conditioning circuits that protect attached load equipment from voltage and current surges due to, for example, lightning strikes or other power disturbances.

BACKGROUND ART

Power conditioning circuits have long been used to protect sensitive load equipment from transients caused by lightning strikes, noise and other power line disturbances. Traditionally, filter elements are used in the line and neutral conductors which trap and/or shunt unwanted power frequencies away from the load. See, for example, Speet et al. U.S. Pat. No. 4,814,941 and Taylor et al. U.S. Pat. No. 5,490,030.

Muelleman U.S. Pat. No. 5,448,443 discloses a power conditioning device and method including an isolation transformer having primary and secondary sides and a ground impedance connected between the secondary side of the isolation transformer at a safety ground and an earth ground. The Muelleman device prevents ground current loops by redirecting transient ground currents to neutral, but does not provide current limiting or noise suppression.

SUMMARY OF THE INVENTION

A power conditioning circuit is simple in design, yet effective to limit damaging transients.

More particularly, according to one aspect of the present invention, a power conditioning circuit for conditioning power supplied by a power source at a nominal frequency over line, neutral and ground conductors includes first through third impedances coupled to the line, neutral and ground conductors, respectively, and to output lines wherein each of the impedances prevents power at frequencies greater than the nominal frequency from reaching the output lines.

Preferably, the first through third impedances comprise first through third inductors coupled in series with the line, neutral and ground conductors, respectively. Still further in accordance with the preferred embodiment, the inductors have substantially equal inductance values.

In accordance with an alternative embodiment, the first through third impedances comprise first through third capacitors coupled across the line, neutral and ground conductors. Still further in accordance with this embodiment, the capacitors may have substantially equal capacitance values.

Means may be provided for limiting voltages across the line, neutral and ground conductors. The limiting means may comprise at least one metal oxide varistor or at least one zener diode.

Still further, an autotransformer may be coupled between the first and second impedances and the output lines.

In accordance with a further aspect of the present invention, a power conditioning circuit; for conditioning power supplied by a power source at a nominal frequency over line, neutral and ground conductors to a load includes first through third inductors coupled in series with the line, neutral and ground conductors, respectively. At least one capacitor is coupled between the conductors and the inductors and the at least one capacitor prevent power at frequencies greater than the nominal frequency from reaching the load.

In accordance with yet another aspect of the present invention, a power conditioning circuit for conditioning power supplied by a power source at a nominal frequency over line, neutral and ground conductors includes a first inductor coupled in series between the line conductor and a first output line and a second inductor coupled in series between the neutral conductor and a second output line. A third inductor is coupled in series between the ground conductor and a third output line and a first capacitor is coupled between the line and neutral conductors. A second capacitor is coupled between the neutral and the ground conductors and a third capacitor is coupled between the line and ground conductors. The inductors and the capacitors prevent power at frequencies greater than the nominal frequency from reaching the output lines.

The power conditioning circuit of the present invention traps unwanted frequencies and/or shunts such frequency components between the line, neutral and ground conductors so that such frequencies are diverted away from sensitive load equipment to prevent damage thereto.

BRIEF DESCRIPTION OF THE PREFERRED EMBODIMENT

Figure 1:
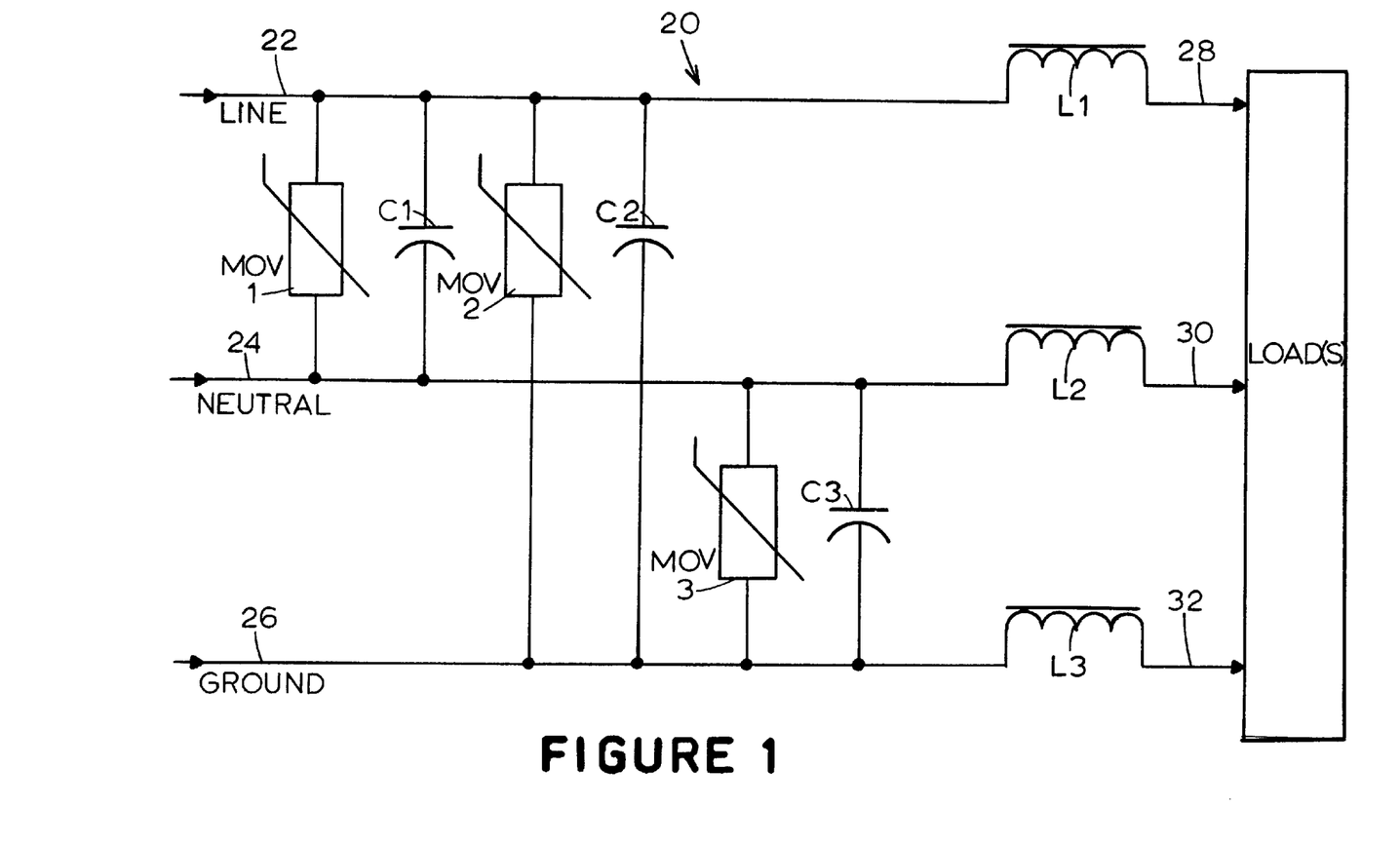
FIG. 1 comprises a schematic diagram of a first embodiment of the present invention.

Referring first to FIG. 1, a power conditioning circuit 20 is connected between line, neutral and ground conductors 22, 24, 26 and output lines 28, 30 and 32. The line, neutral and ground conductors may be connected to a commercial source of power or any other power source. The output lines 28, 30 and 32 may be connected to one or more loads 34.

The power conditioning circuit 20 further includes first, second and third inductors L1, L2 and L3 connected in series between the line, neutral and ground conductors 22, 24 and 26 and the output lines 28, 30 and 32. First through third capacitors C1, C2 and C3 are connected across the line and neutral conductors 22, 24, the line and ground conductors 22, 26 and the neutral and ground conductors 24, 26, respectively. Optional metal oxide varistors MOV1, MOV2 and MOV3 are coupled across the capacitors C1, C2 and C3, respectively.

Preferably, although not necessarily, the inductance values of the inductors L1–L3 are equal. Also preferably, (but not necessarily) the capacitors C1–C3 have substantially equal capacitance values. Further, the metal oxide varistors MOV1 and MOV2 must be sized large enough to dissipate large voltage spikes caused, for example, by a lightning strike and should, for example, typically have breakdown voltages on the order of 150–200 volts. In contrast, the varistor MOV3 resides on the ground leg and, therefore, is not exposed to large voltage spikes and should typically have a voltage breakdown level of, for example, 10 volts.

In operation, transients appearing on any of the line, neutral and ground conductors 22, 24 and 26 having one or more frequency components in excess of the nominal (typically 60 Hz) frequency of the power supplied thereto are attenuated by the inductors L1–L3, which have an increasing impedance with frequency. In addition, these transients are shunted by the capacitors C1–C3 away from the load(s) 34. In addition, the metal oxide varistors MOV1–MOV3 limit the voltage magnitudes appearing across the line, neutral and ground conductors 22–26.

The actual inductance and capacitance values for the inductors L1–L3 and the capacitors C1–C3 may be selected so as to obtain the desired filtering characteristics on the lines 28–32.

It should be noted that the circuit of 20 of FIG. 1 can be modified by omitting one or more of the elements therefrom. Thus, for example, one or more of the varistors MOV1–MOV3 may be omitted, as may one or more of the capacitors C1–C3 and/or one or more of the inductors L1–L3.

Figure 2:
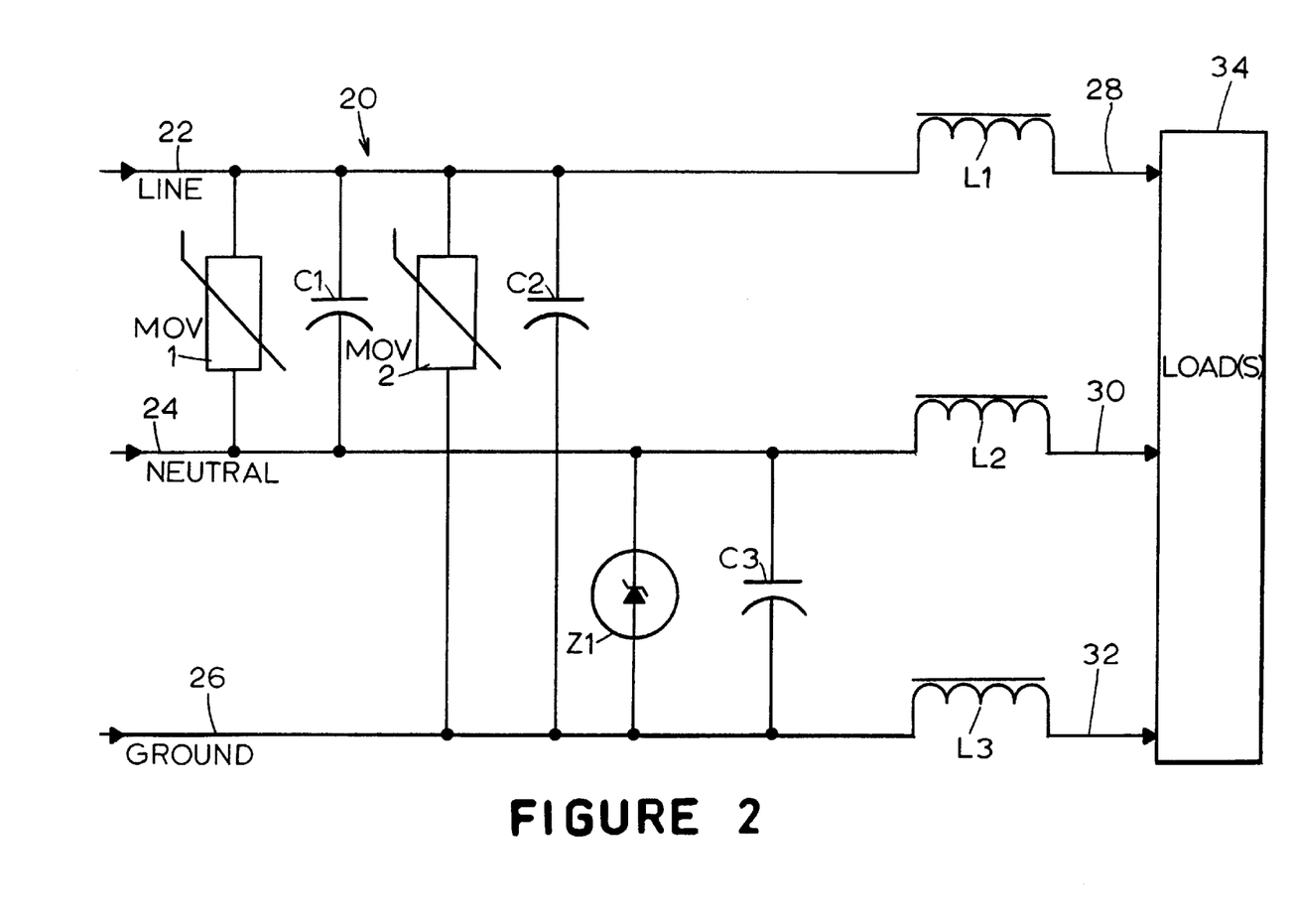
FIGS. 2–9 are schematic diagrams of alternative embodiments of the present invention.
Figure 3:
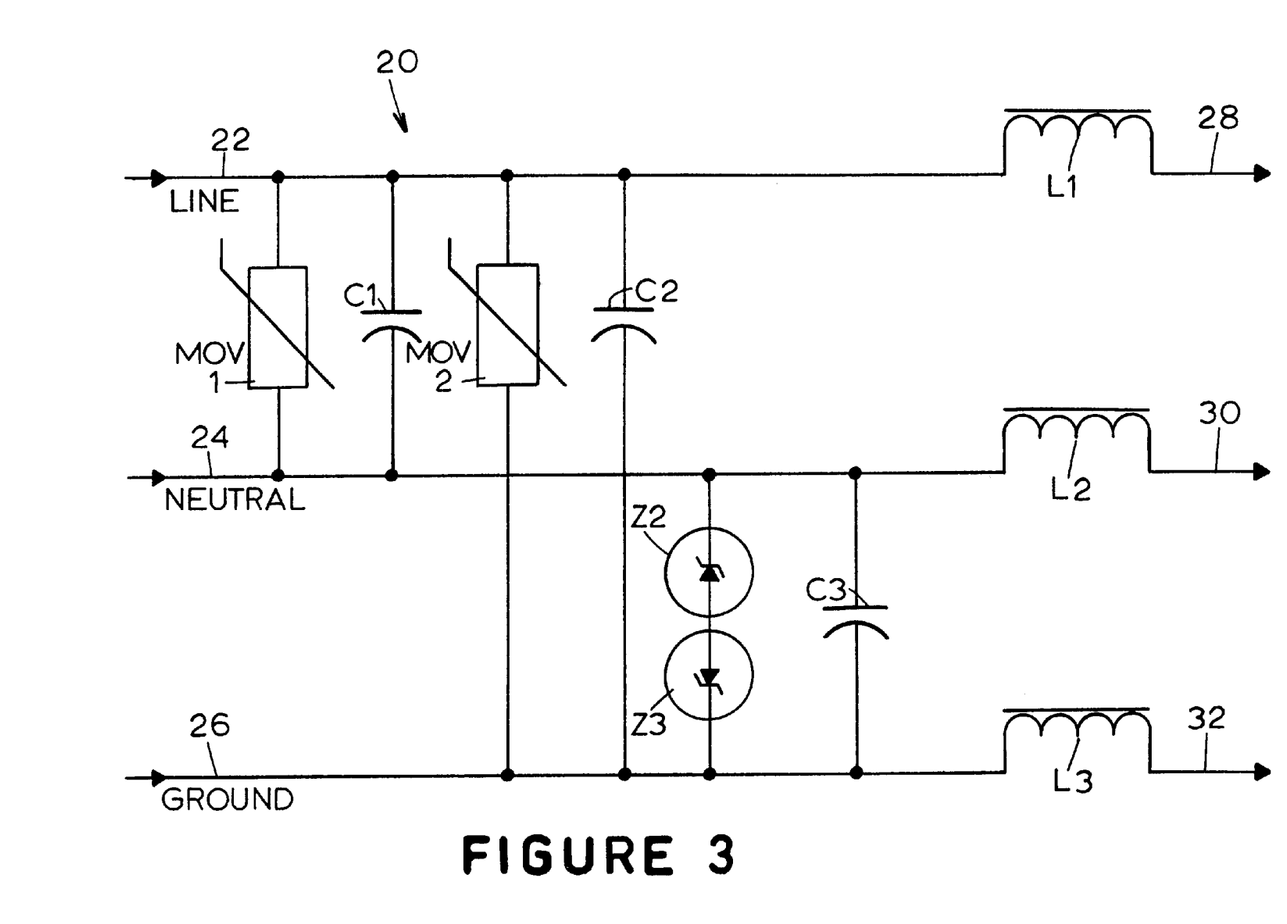

FIGS. 2–9 illustrate alternative embodiments of the present invention wherein elements common to the Figs. are assigned like reference numerals. Referring first to FIG. 2, one or more of the varistors MOV1–MOV3 may be replaced by a different voltage limiting element. Thus, for example, the varistor MOV3 may be replaced by a zener diode Z1. In a still further embodiment of the present invention as seen in FIG. 3, any or all of the varistors MOV1–MOV3 may be replaced by combinations of voltage controlling devices, for example, back-to-back series-connected zener diodes Z2 and Z3. Zener diodes positioned in this manner enable clamping of bidirectional voltage levels. Note that the zener diodes are not capable of dissipating large amounts of power, but, instead, are intended to provide very precise, low level voltage clamping. As a result, in applications requiring large amounts of power dissipation MOVs should be used instead of zener diodes. The precise, low level voltage clamping performed by the zener diodes enables voltage control for the load ground. In computer applications low level voltage clamping on the ground leg is especially advantageous because ground attaches directly to the microprocessor and is therefore a potential source of damaging voltage spikes.

Figure 5:
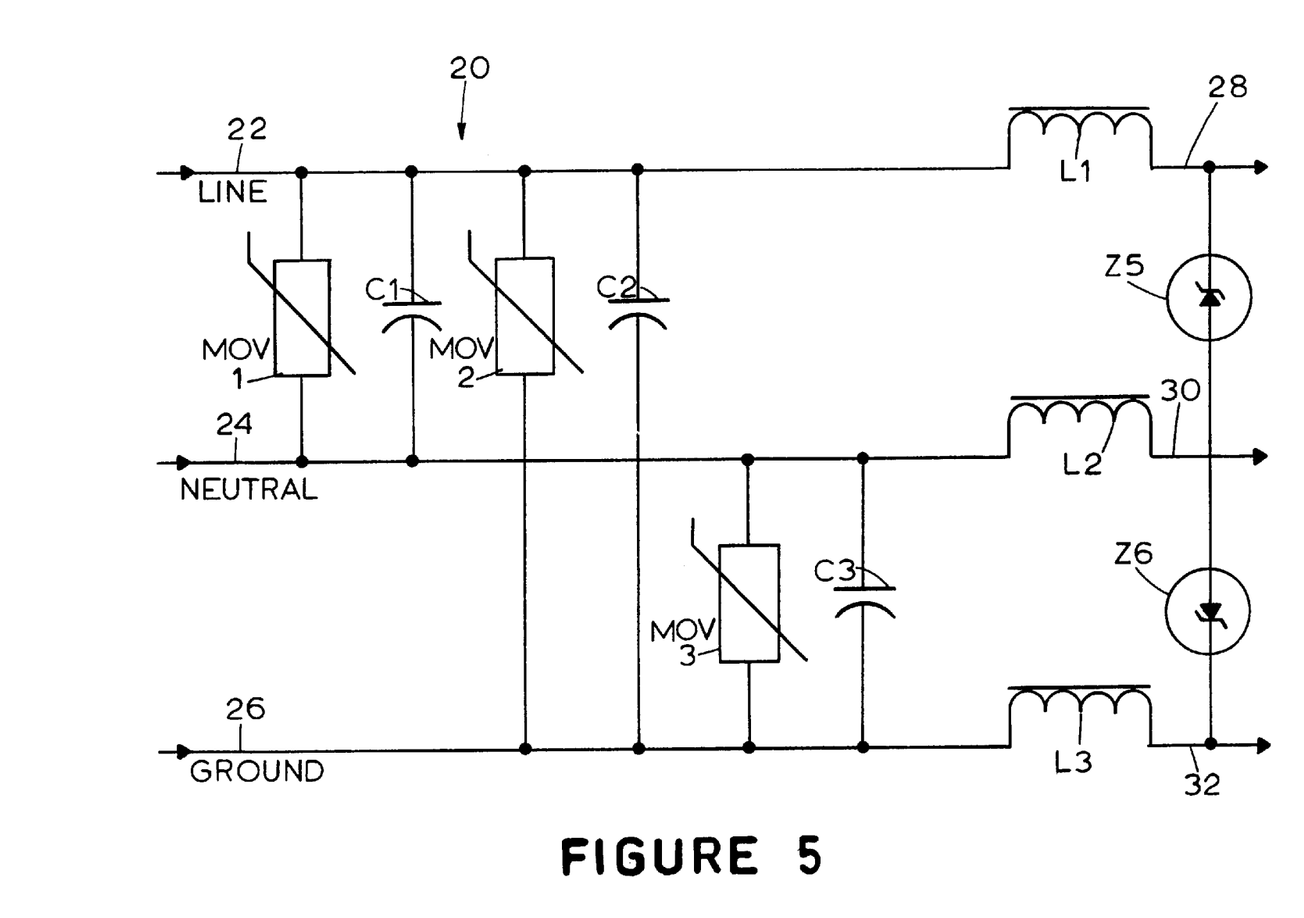
Figure 6:
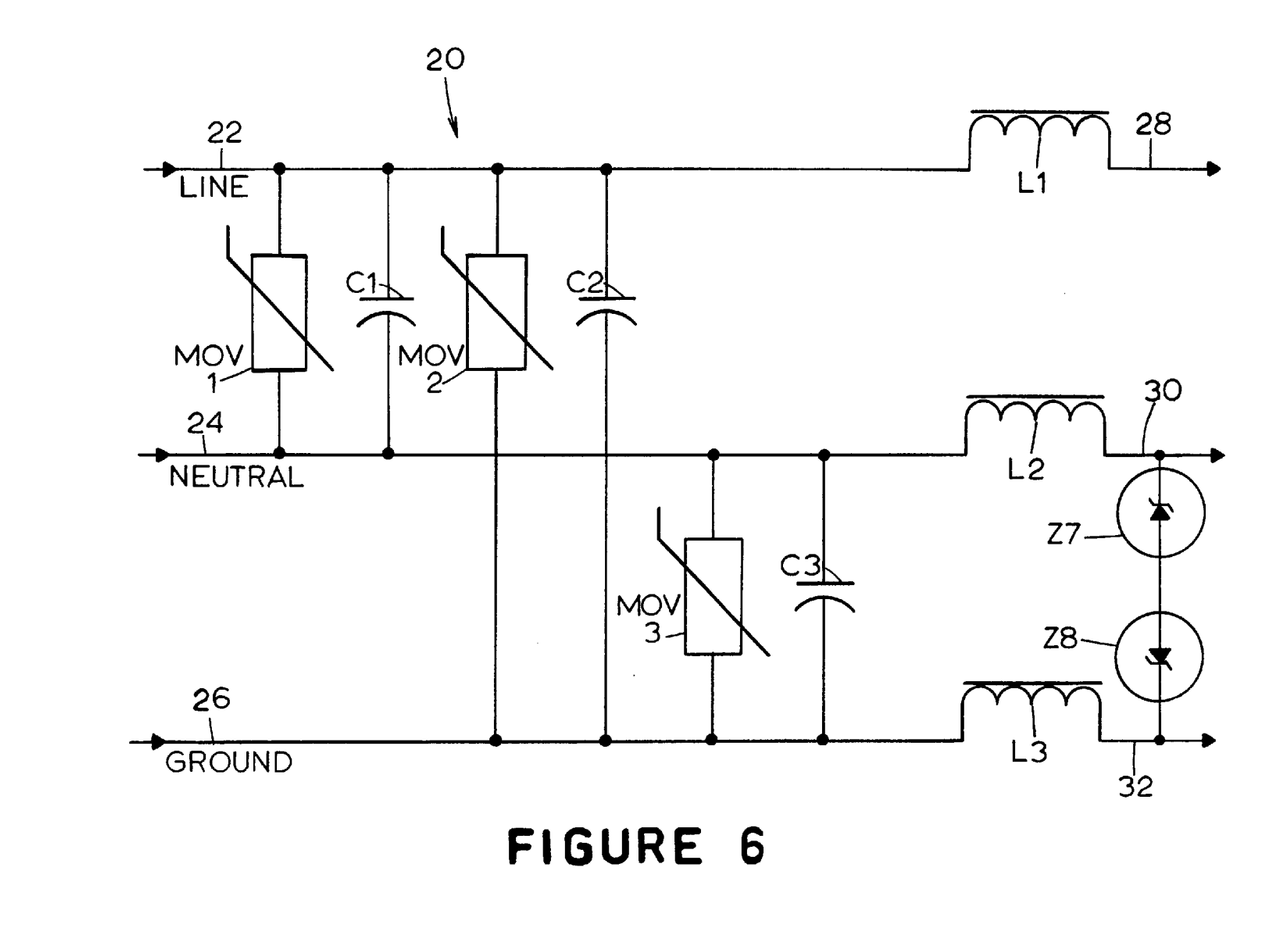

FIG. 5 illustrates an embodiment wherein the circuit 20 is provided with back-to-back series-connected zener diodes Z5 and Z6 which are connected across the lines 28 and 32. If desired in any embodiment, other pairs of back-to-back diodes may be connected across the lines 28 and 30 or across the lines 30 and 32 (see FIG. 6 which zener diodes Z7 and Z8 are coupled between the lines 30 and 32).

Figure 7:
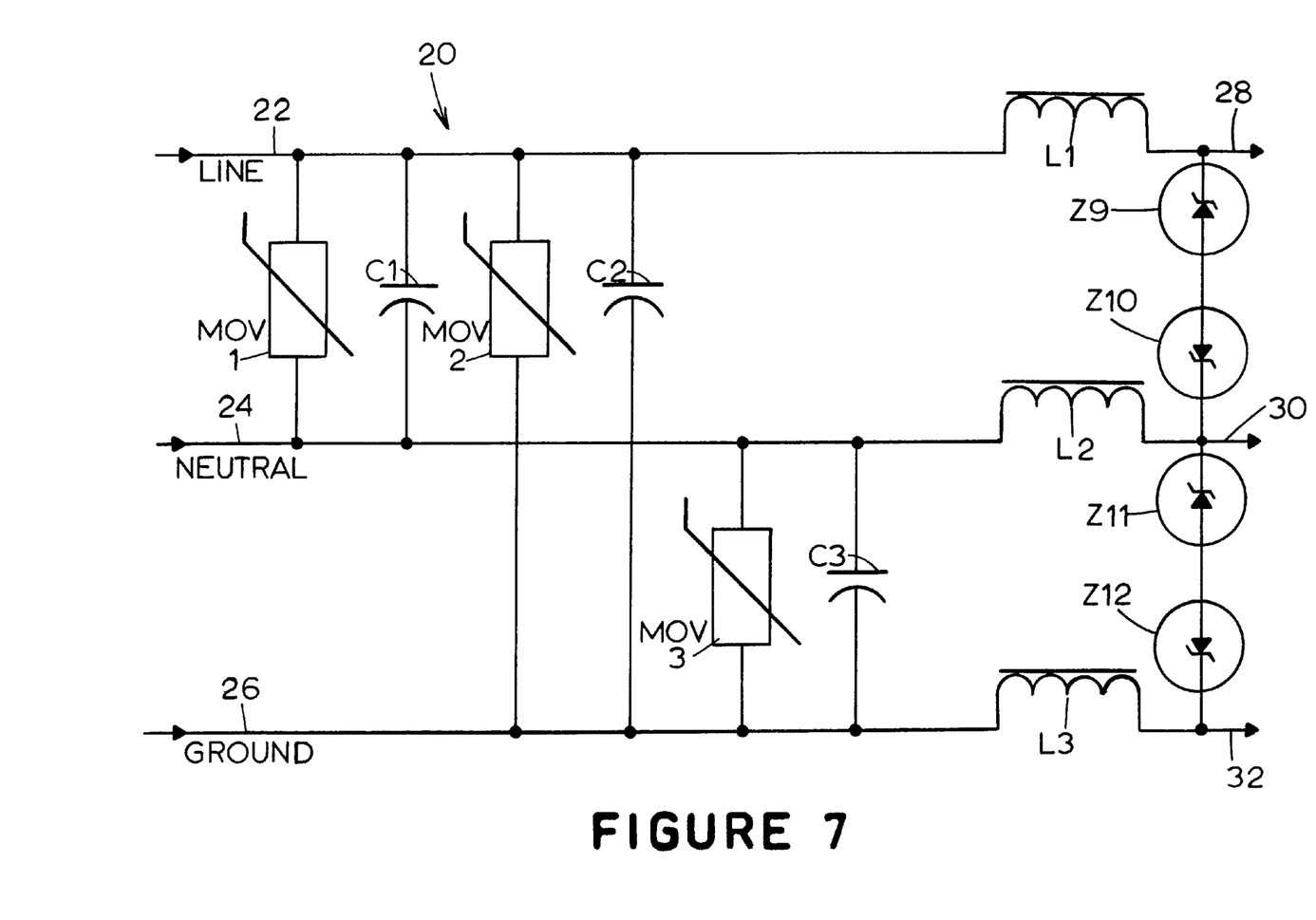

FIG. 7 illustrates an embodiment wherein back-to-back zener diodes Z9 and Z10 are connected in series across the conductors 28 and 30 and back-to-back zener diodes Z11 and Z12 are connected in series across the conductors 30 and 32.

Figure 4:
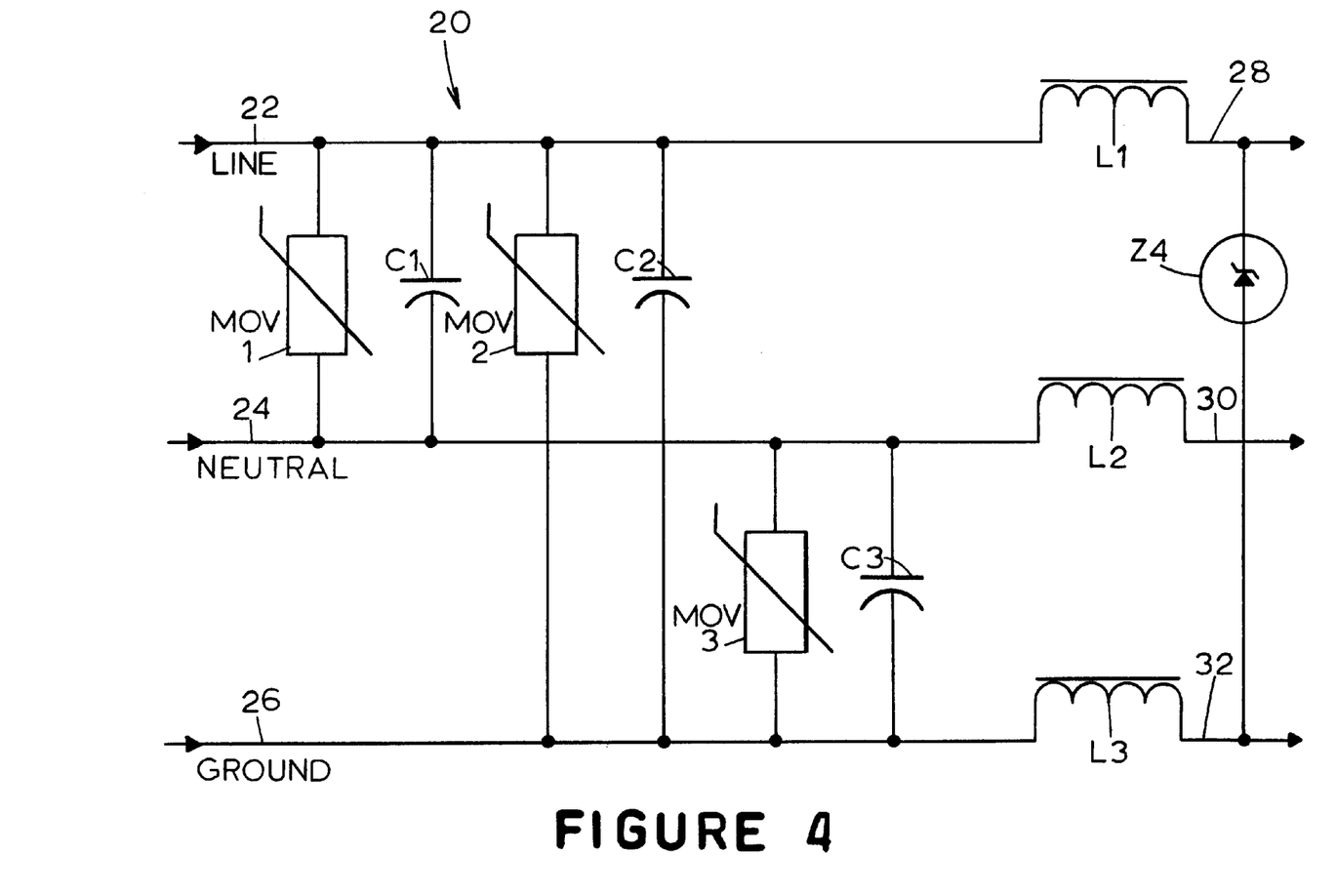

Referring to FIG. 4, one or more zener diodes or any other voltage limiting elements may be connected across point of output lines. Thus, for example, a zener diode Z4 may be coupled across the output lines 28 and 32.

Figure 8:
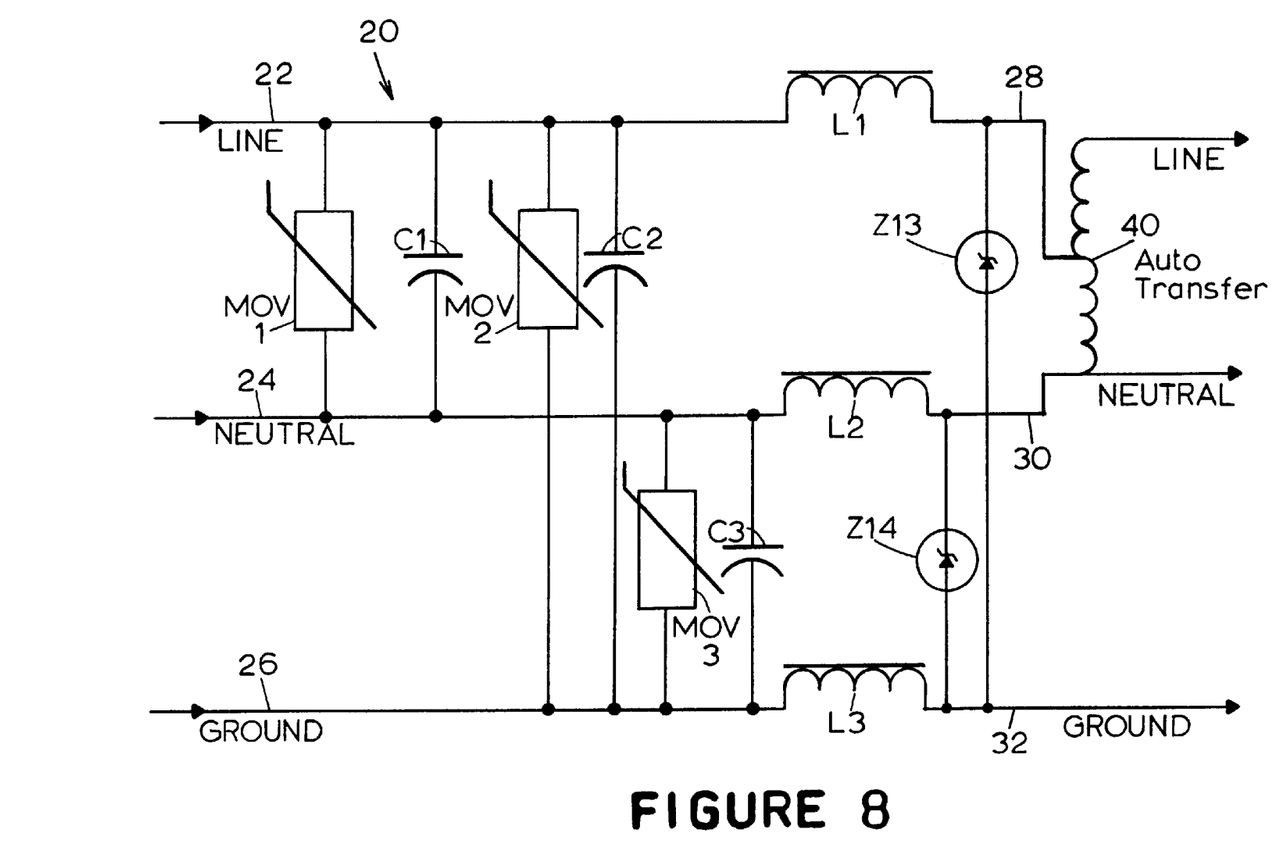

Shown in FIG. 8 is an embodiment wherein an autotransformer 40 is connected across the lines 28 and 30 to compensate for the voltage drops across inductors L1 and L2 and wherein zener diodes Z13 and Z14 are connected across the lines 28, 32 and across the lines 30, 32, respectively.

Figure 9:
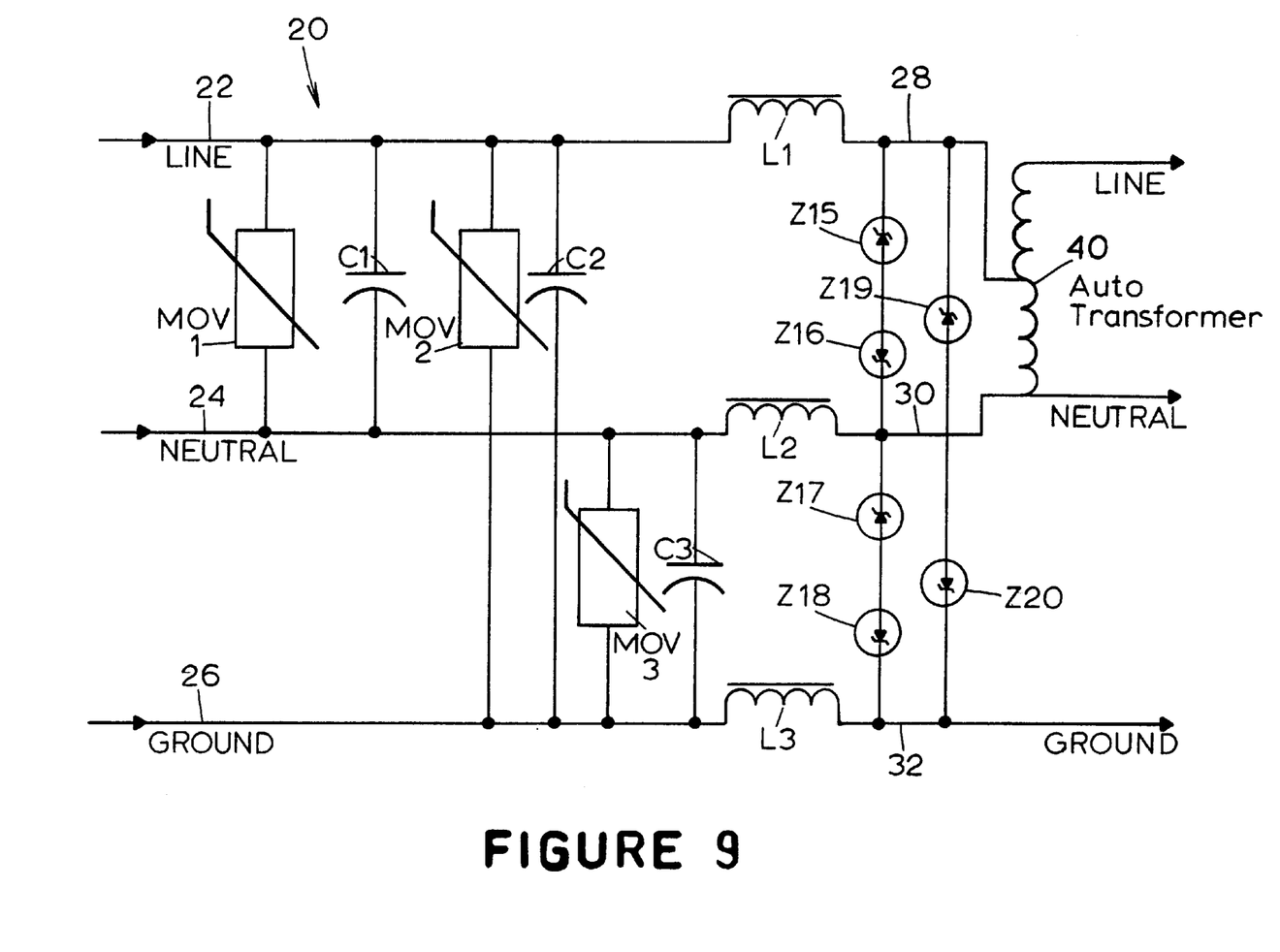

FIG. 9 illustrates yet another embodiment wherein back-to-back zener diodes Z15, Z16 are coupled across the lines 28 and 30, back-to-back zener diodes Z17 and Z18 are coupled in series across the lines 30 and 32 and back-to-back zener diodes Z19 and Z20 are coupled in series between the conductors 28 and 32. In addition, the autotransformer 40 of FIG. 8 is coupled to the lines 28 and 30.

In each embodiment, protection against transients resulting from line disturbances is afforded in a simple and inexpensive manner.

Numerous modifications and alternative embodiments of the present invention will be apparent to those skilled in the art in view of the foregoing description. Accordingly, this description is to be construed as illustrative only and is only for the purpose of teaching those skilled in the art the best mode of carrying out the invention. The details of the structure and/or function may be varied substantially without departing from the spirit of the invention, and the exclusive use of all modifications which come within the scope of the appended claims is reserved.

We claim:

1. A power conditioning circuit for conditioning power supplied by a power source at a nominal frequency over line, neutral and ground conductors to first second and third output lines, respectively, comprising:

first, second and third inductors coupled in series between the line, neutral and ground conductors, respectively, and the first, second and third output lines, respectively, wherein all of the power supplied by the power source to the first, second and third output lines flows through the first, second and third inductors, each of the inductors blocking power at frequencies greater than the nominal frequency thereby to prevent power at frequencies greater than the nominal frequency from reaching the first, second and third output lines.

2. The power conditioning circuit of claim 1, wherein the inductors have substantially equal inductance values.

3. The power conditioning circuit of claim 1, further including means for limiting voltages across the line, neutral and ground conductors.

4. The power conditioning circuit of claim 3, wherein the limiting means comprises at least one metal oxide varistor.

5. The power conditioning circuit of claim 3, wherein the limiting means comprises at least one zener diode.

6. The power conditioning circuit of claim 1, further including an autotransformer coupled between the first and second impedances and the output lines.

7. A power conditioning circuit for conditioning power supplied by a power source at a nominal frequency over line, neutral and ground conductors to first, second and third output lines, respectively, wherein the first, second and third output lines are coupled to a load, comprising:

first, second and third inductors coupled in series between the line, neutral and ground conductors, respectively, and the first, second and third output lines, respectively, wherein all of the power supplied by the power source to the first, second and third output lines flows through the first, second and third inductors;

at least one capacitor coupled between the conductors wherein one end of the capacitor is coupled to at least one of the conductors at a point between the power source and the inductors;

wherein the inductors block power at frequencies greater than the nominal frequency thereby preventing power at frequencies greater than the nominal frequency from reaching the load; an wherein the at least one capacitor shunts power at frequencies greater than the nominal frequency.

8. The power conditioning circuit of claim 7, wherein the inductors have substantially equal inductance values.

9. The power conditioning circuit of claim 7, wherein first, second and third capacitors are coupled across the line, neutral and ground conductors, and further wherein a first end of each capacitor is coupled to a conductor, the conductor being one of the line, neutral and ground conductors, at a point that is located between the power source and the respective inductor that is coupled in series with the conductor.

10. The power conditioning circuit of claim 9, wherein the capacitors have substantially equal capacitance values.

11. The power conditioning circuit of claim 7, further including means for limiting voltages across the line, neutral and ground conductors.

12. The power conditioning circuit of claim 11, wherein the limiting means comprises at least one metal oxide varistor.

13. The power conditioning circuit of claim 11, wherein the limiting means comprises at least one zener diode.

14. The power conditioning circuit of claim 7, further including an autotransformer coupled between the first and second inductors and the first and second output lines.

15. A power conditioning circuit for conditioning power supplied by a power source at a nominal frequency over line, neutral and ground conductors to first, second and third output lines, respectively, comprising:

first, second and third inductors coupled in series between the line, neutral and ground conductors, respectively, and the first, second and third output lines, respectively, wherein all of the power supplied by the power source to the first, second and third output lines flows through the first, second and third inductors;

a first capacitor coupled between the line and neutral conductors wherein a first end of the first capacitor is coupled to the line conductor at a point between the power source and the first inductor and wherein a second end of the first capacitor is coupled to the neutral conductor at a point between the power source and the second inductor;

a second capacitor coupled between the neutral and ground conductors wherein a first end of the second capacitor is coupled to the neutral conductor at a point between the power source and the second inductor and wherein a second end of the second capacitor is coupled to the ground conductor at a point between the power source and the third inductor;

a third capacitor coupled between the line and ground conductors wherein a first end of the third capacitor is coupled to the line conductor at a point between the power source and the first inductor and wherein a second end of the third capacitor is coupled to the ground conductor at point between the power source and the third inductor;

wherein the inductors block power at frequencies greater than the normal frequency thereby preventing power at frequencies greater than the nominal frequency from reaching the output lines; and wherein the capacitors shunt power at frequencies greater than the nominal frequency.

16. The power conditioning circuit of claim 15, wherein the inductors have substantially equal inductance values.

17. The power conditioning circuit of claim 16, wherein the capacitors have substantially equal capacitance vales.

18. The power conditioning circuit of claim 17, further including means for limiting voltages across the line, neutral and ground conductors.

19. The power conditioning circuit of claim 18, wherein the limiting means comprises at least one metal oxide varistor.

20. The power conditioning circuit of claim 18, wherein the limiting means comprises at least one zener diode.

* * * * *